United States Patent [19]

Haruki et al.

[11] 4,246,539
[45] Jan. 20, 1981

[54] FREQUENCY SYNTHESIZING SYSTEM FOR AM-SSB TRANSCEIVER

[75] Inventors: Hiroshi Haruki, Yokohama; Masahiro Watanabe, Sagamihara, both of Japan

[73] Assignee: Matsushita Electric Industrial Co., Ltd., Kadoma, Japan

[21] Appl. No.: 30,387

[22] Filed: Apr. 16, 1979

[30] Foreign Application Priority Data

Apr. 20, 1978 [JP] Japan ................... 53-47448

[51] Int. Cl.² ............................................. H04B 1/40
[52] U.S. Cl. .................................. 455/76; 455/87
[58] Field of Search ............... 325/17, 20, 25, 184

[56] References Cited

U.S. PATENT DOCUMENTS 4,097,805  6/1978  Fujii .................... 325/20 UX

Primary Examiner—Harold T. Pitts
Attorney, Agent, or Firm—Stevens, Davis, Miller & Mosher

[57] ABSTRACT

A frequency synthesizing system for use in an AM-SSB transceiver of double conversion type comprising a single crystal oscillator in its PLL synthesizer. The fundamental frequency of the PLL synthesizer provided by the oscillation of the crystal oscillator is selected to be n times (where n is an even number) the second intermediate frequency of the transceiver so that all the frequencies required for the operation of the AM-SSB transceiver can be derived from the oscillation frequency of the single crystal oscillator, whereby to simplify the structure of the AM-SSB transceiver and to facilitate the adjustment of the transceiver.

10 Claims, 10 Drawing Figures

FREQUENCY SYNTHESIZING SYSTEM FOR AM·SSB TRANSCEIVER

BACKGROUND OF THE INVENTION

A frequency synthesizing device, for example, a PLL synthesizer is generally used for the frequency synthesis in AM·SSB(U, L) transceivers. The synthesizer of this kind includes generally a single crystal oscillator or a plurality of crystal oscillators.

An AM·SSB(U, L) transceiver employing a PLL synthesizer including a single crystal oscillator is disclosed in, for example, U.S. Pat. No. 3,983,484. However, the transceiver disclosed in this U.S. patent has the following defects:

(a) For the synthesis of the transmitting and receiving frequencies of the AM·SSB(U, L) transceiver, exclusive SSB filters for the upper and lower side bands are indispensably required.

(b) Due to the fact that the output frequency of the PLL synthesizer during the signal transmission differs from that during the signal reception, it is necessary to change over the variable frequency division ratio N of the programmable divider depending on the transmission or reception, and the voltage controlled oscillator must be repeatedly locked and unlocked depending on the signal transmission or reception.

(c) For the purpose of signal transmission, fine adjustment is required to shift the fundamental frequency, 10.24 MHz of the PLL synthesizer to 10.238102 MHz. Therefore, there occurs a maximum frequency shift of 80 Hz in the carrier frequencies for the 1st to 40th channels, as follows:

1st channel (26.965 MHz)

$$f_T = \frac{10.238102}{1024} \times 1673 + 10.238102$$
$$\approx 26.965 \text{ MHz (Error} = 0)$$

40th channel (27.405 MHz)

$$f_T = \frac{10.238102}{1024} \times 1717 + 10.238102$$
$$= 27.40492 \text{ MHz (Error} = 80 \text{ Hz)}$$

SUMMARY OF THE INVENTION

It is an object of the present invention to provide a frequency synthesizing system for use in an AM·SSB transceiver of double conversion type in which a single SSB filter, which is expensive, is only used in each of the transmitting and receiving sections, and a PLL synthesizer including a single crystal oscillator is employed to synthesize all the frequencies required for the operation of the transceiver in the AM·SSB(U) and SSB(L) transmission and reception modes.

Another object of the present invention is to provide a frequency synthesizing system of the above character which eliminates the prior art necessity for the changeover of the variable frequency division ratio N of the programmable divider in the PLL synthesizer depending on the signal transmission or reception and which eliminates also the necessity for the fine adjustment on the fundamental frequency thereby obviating the undesirable frequency shift.

Still another object of the present invention is to provide a frequency synthesizing system of the above character in which the fundamental frequency of the PLL synthesizer provided by the oscillation of the single crystal oscillator is selected to be n times (where n is an even number) the second intermediate frequency (abbreviated hereinafter as the 2nd IF) of the transceiver so that all the frequencies required for the operation of the AM·SSB transceiver can be derived from the oscillation frequency of the single crystal oscillator.

DESCRIPTION OF THE PREFERRED EMBODIMENTS

Figure 1:
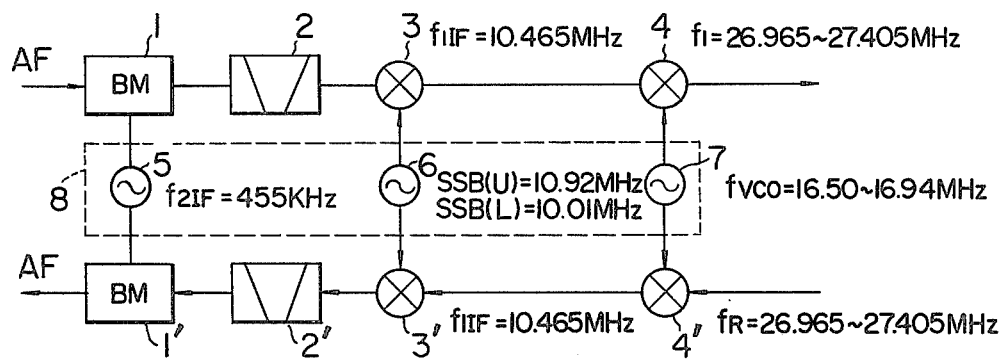
FIG. 1 shows the structure of a basic embodiment of the present invention adapted for the SSB transmission and reception.

Suppose now that a double-conversion type AM·SSB transceiver operates with a 2nd IF having a frequency $f_2IF$ of 455 kHz and a transmitting and receiving frequency $f_{T,R}$ of 26.965 MHz to 27.405 MHz. Then, individual other operating frequencies of the double-conversion type AM·SSB transceiver are determined in a manner as described below. At first, the fundamental frequency $X_o$ of a PLL synthesizer in the transceiver is selected to be n times (where n is an even number) the frequency $f_2IF$ of the 2nd IF. For example, this $X_o$ is selected to be as follows:

$$X_o = 2 \times M(=11) \times 0.455 \tag{1}$$
$$= 10.01 \text{ MHz}$$

This fundamental frequency $X_o$ is then divided by the factor of M (=11) to obtain a frequency $f_1=910$ kHz which is two times the frequency $f_2IF=455$ kHz, as follows:

$$f_1 = 2 \times f_2IF = (X_o/M) = 0.91 \text{ MHz} \tag{2}$$

This frequency $f_1$ is then divided by the factor of 2 to obtain the 2nd IF having the frequency $f_2IF=455$ kHz, as follows:

$$f_2IF = (f_1/2) = 0.455 \text{ MHz} \qquad (3)$$

The fundamental frequency $X_o$ and the double frequency $f_1$ are then mixed to obtain a frequency $f_2$ representing the sum of them, as follows:

$$f_2 = X_o + f_1 = 10.92 \text{ MHz} \qquad (4)$$

Then, a first intermediate frequency (abbreviated hereinafter as a 1st IF) having a frequency $f_1IF$ is selected to be the sum of $X_o + f_2IF$, as follows:

$$f_1IF = X_o + f_2IF = 10.465 \text{ MHz} \qquad (5)$$

The frequency $X_o$ is employed as a second local oscillation frequency when the lower side band SSB(L) is used for the transmission and reception, while the frequency $f_2$ is employed as the second local oscillation frequency when the upper side band SSB(U) is used.

A first local oscillation frequency $f_{vco}$ provided by a voltage controlled oscillator in the PLL synthesizer is selected as follows:

$$\begin{aligned} f_{vco} &= f_{T,R} - f_1IF \\ &= 16.50 \text{ MHz} \sim 16.94 \text{ MHz} \end{aligned} \qquad (6)$$

In the above equation (6), the value of $f_1IF$ is selected to satisfy the equation (5).

FIG. 1 shows the structure of a basic embodiment of the present invention adapted for the SSB transmission and reception, and the frequencies given by the equations (1) to (2) are utilized for the purpose. Referring to FIG. 1, the transmitting section of the transceiver includes a balanced modulator 1, a 453.5-kHz SSB filter 2, a second mixer 3 and a first mixer 4. The receiving section of the transceiver includes a first mixer 4', a second mixer 3', a 453.5-kHz SSB filter 2' and a balanced demodulator 1'. A PLL synthesizer 8 includes a 2nd IF signal source 5, a second local oscillation frequency signal source 6 and a first local oscillation frequency signal source 7. The 2nd IF signal is applied from the source 5 to the balanced modulator 1 in the transmitting section and to the balanced demodulator 1' in the receiving section. The second local oscillation frequency signal is applied from the source 6 to the second mixers 3 and 3' in the transmitting and receiving sections respectively. The first local oscillation frequency signal is applied from the source 7 to the first mixers 4 and 4' in the transmitting and receiving sections respectively.

Figure 2:
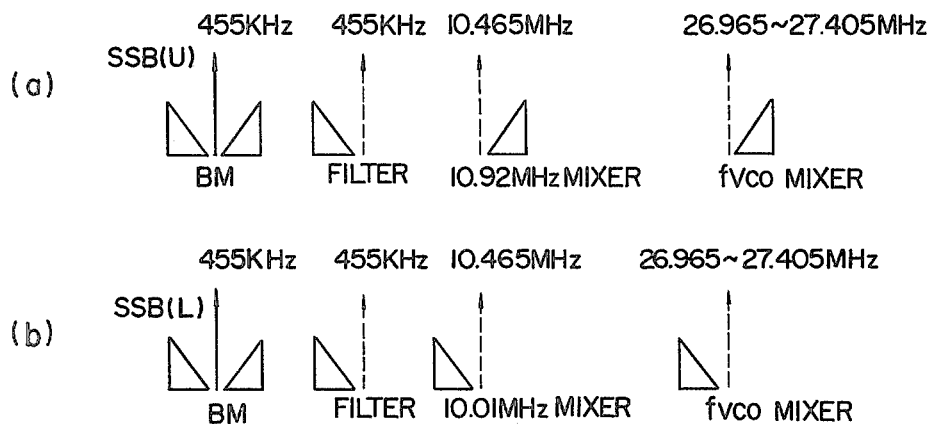
FIG. 2 shows in (a) and (b) the frequency spectra of the operating frequencies when the upper and lower side bands respectively are used for the transmission and reception in the embodiment shown in FIG. 1.

FIG. 2 shows in (a) and (b) the frequency spectra of the operating frequencies when the upper side band SSB(U) and lower side band SSB(L) respectively are used for the transmission and reception in the basic embodiment shown in FIG. 1. Namely, in the case of the transmission of the upper side band (a), the SSB filter 2 filters out the IF carrier of 455 kHz and upper side band to obtain the lower side band, the frequency $f_2$ of 10.92 MHz is mixed with the filter output to extract the subtracted component comprising the reversed side band with respect to the frequency of 10.465 MHz, and the frequency of $f_{vco}$ is mixed to extract the summed component comprising the upper side band with respect to the frequency of 26.965 to 27.405 MHz. In the case of the transmission of the lower side band (b), the frequency $X_o$ of 10.01 MHz is mixed with the filter output to extract the summed component comprising the lower side band with respect to the frequency of 10.465 MHz, and the frequency $f_{vco}$ is mixed to extract the summed component comprising the lower side band with respect to the frequency of 26.965 to 27.405 MHz.

Figure 3:
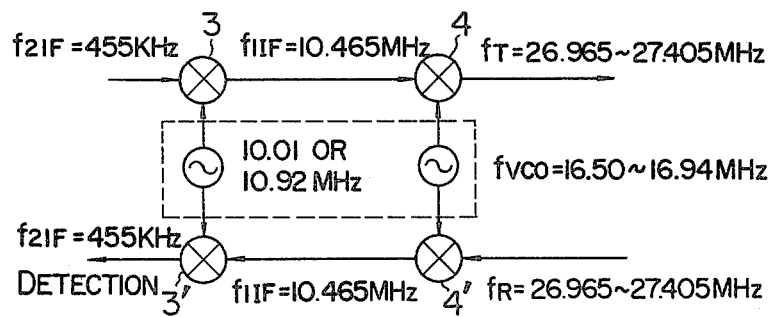
FIG. 3 shows the structure of another basic embodiment of the present invention adapted for the AM transmission and reception.

FIG. 3 shows the structure of another basic embodiment of the present invention adapted for the AM transmission and reception. Like reference numerals designate like elements shown in FIG. 1.

Figure 4:
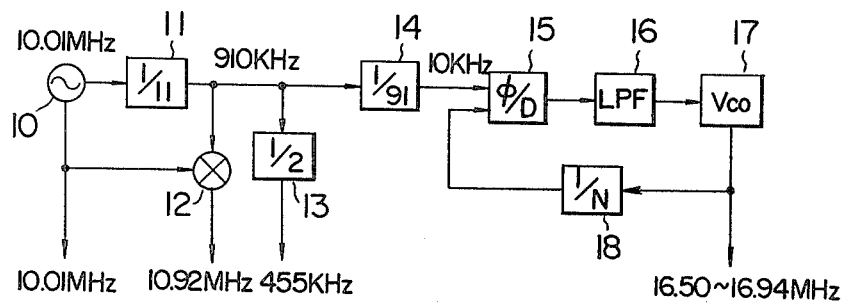
FIGS. 4 and 5 show the structures of two embodiments of the present invention in which the first local oscillation frequency $f_{vco}$ is directly divided by the programmable divider.

FIG. 4 shows the practical structure of an embodiment of the present invention in which a single crystal oscillator generating the fundamental frequency is provided in the PLL synthesizer for providing all the frequencies required for the operation of the transceiver having the aforementioned structure.

Referring to FIG. 4, a crystal oscillator 10 oscillates at the fundamental frequency $X_o = 10.01$ MHz. A first fixed frequency divider 11 divides the fundamental frequency $X_o = 10.01$ MHz by the factor of $M = 11$ to provide the frequency $f_1 = 910$ kHz. A mixer 12 mixes the output frequency $X_o = 10.01$ MHz of the crystal oscillator 10 with the output frequency $f_1 = 910$ kHz of the first fixed frequency divider 11 to provide the frequency $f_2 = 10.92$ MHz. A second fixed frequency divider 13 divides the output frequency $f_1 = 910$ kHz of the first fixed frequency divider 11 by the factor of 2 to provide the frequency $f_2IF = 455$ kHz. A third fixed frequency divider 14 divides the output frequency $f_1 = 910$ kHz of the first fixed frequency divider 11 by the factor of 91 to provide a frequency of 10 kHz. The 10-kHz output signal of the third fixed frequency divider 14 provides one of the two inputs to a phase comparator 15. The output of the phase comparator 15 is connected through a low-pass filter 16 to a voltage controlled oscillator 17 which is voltage-controlled by the output signal of the phase comparator 15 to provide the first local oscillation frequency $f_{vco} = 16.50$ MHz to 16.94 MHz. The output frequency $f_{vco} = 16.50$ MHz to 16.94 MHz appearing from the voltage controlled oscillator 17 is directly divided by the factor of N by a programmable divider 18 to provide the other input to the phase comparator 15. The elements above described may be those well known in the art as far as they can provide the predetermined outputs individually.

Figure 5:
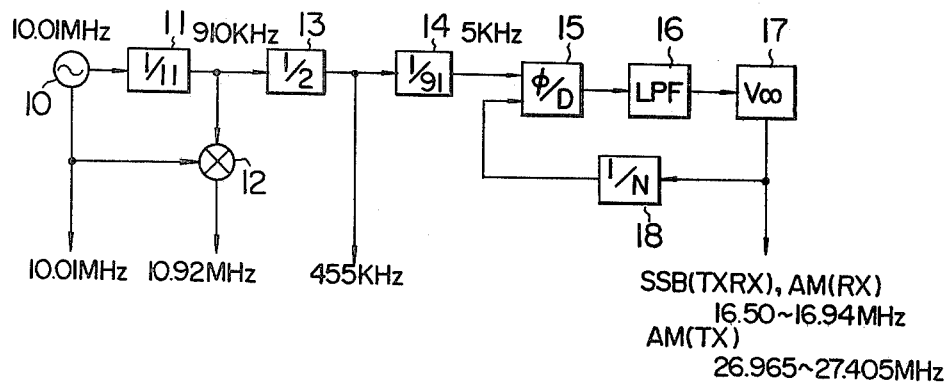

FIG. 5 shows a modification of the system shown in FIG. 4. In the modification shown in FIG. 5, the output frequency $f_2IF = 455$ kHz of the second fixed frequency divider 13 is divided by the factor of 91 by the third fixed frequency divider 14 to provide a frequency of 5 kHz which is applied as the first input to the phase comparator 15.

Figure 6:
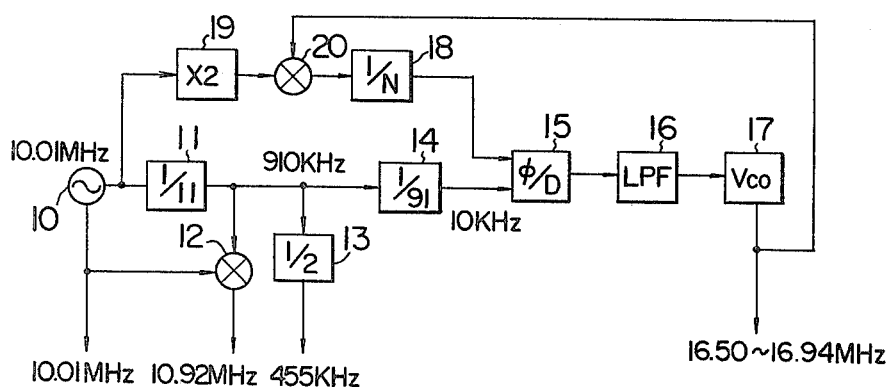
FIG. 6 shows the structure of another embodiment of the present invention in which a multiplied frequency of the fundamental frequency and the first local oscillation frequency $f_{vco}$ are subjected to analog mixing, and the resultant frequency is then divided by the programmable divider.

FIG. 6 shows another modification of the system shown in FIG. 4. In the modification shown in FIG. 6, the output frequency $f_{vco} = 16.50$ MHz to 16.94 MHz of the voltage controlled oscillator 17 is not directly divided by the factor of N by the programmable divider 18. In this modification, the fundamental frequency $X_o = 10.01$ MHz is multiplied by the factor of 2 by a frequency multiplier 19, and the output frequency of this frequency multiplier 19 and the output frequency $f_{vco}$ of the voltage controlled oscillator 17 are subjected to analog mixing in an analog mixer 20, and the output frequency of this mixer 20 is then divided by the factor of N by the programmable divider 18.

Figure 7A:
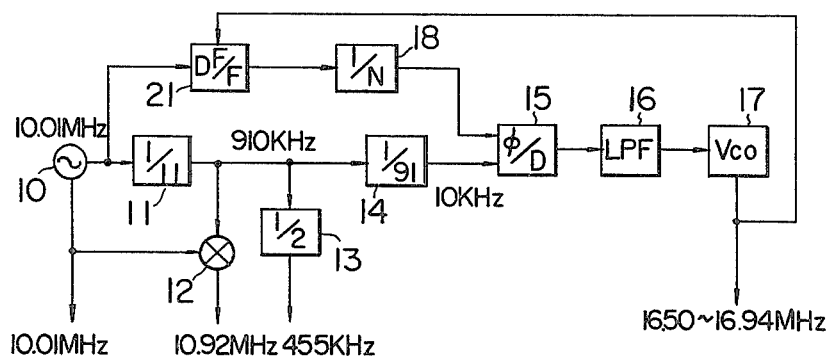
FIGS. 7A and 8A show the structures of other embodiments of the present invention in which the fundamental frequency or its divided frequency and the first local oscillation frequency $f_{vco}$ are subjected to digital mixing in a D flip-flop, and the resultant frequency is then divided by the programmable divider.
Figure 7B:
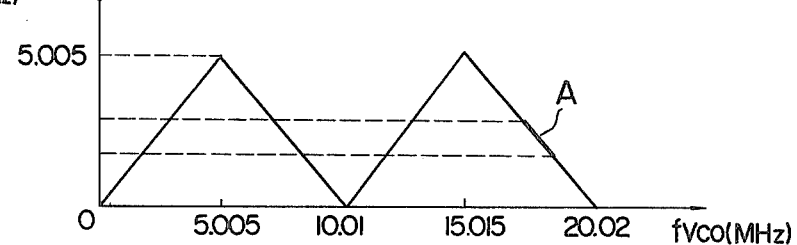
FIGS. 7B and 8B show the relation between the output frequency of the D flip-flop and the first local oscillation frequency $f_{vco}$ applied to the D flip-flop in FIGS. 7A and 8B respectively.

FIG. 7A shows a modification of the system shown in FIG. 6. In the modification shown in FIG. 7A, the fundamental frequency $X_o = 10.10$ MHz and the first local oscillation frequency $f_{vco} = 16.50$ MHz to 16.94 MHz are applied to a D flip-flop 21 to be subjected to digital mixing, and the output frequency of the flip-flop 21 is then divided by the factor of N by the programmable divider 18. FIG. 7B shows the relation between the output frequency of the D flip-flop 21 and the input frequency $f_{vco}$ applied thereto, and the symbol A represents the operating regions.

Figure 8A:
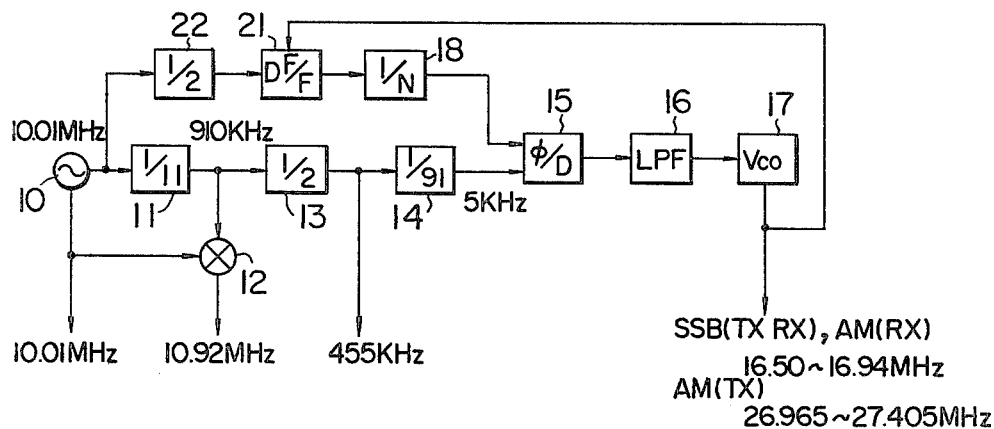
Figure 8B:
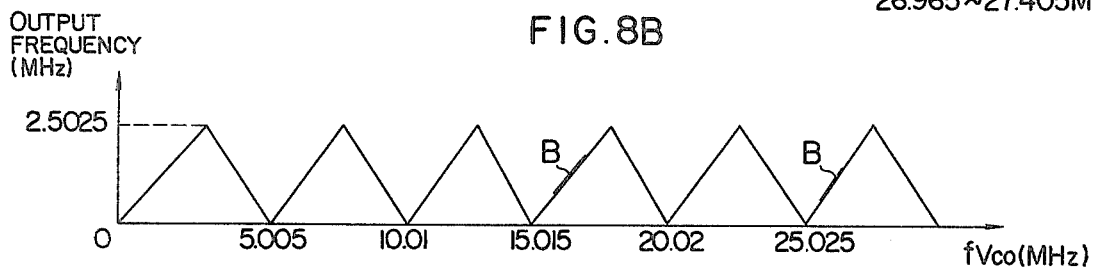

FIG. 8A shows a modification of the system shown in FIG. 7A, In the modification shown in FIG. 8A, the input frequency of 5 kHz is applied as one input to the phase comparator 15 as in the case of FIG. 5, and a frequency obtained by dividing the fundamental frequency $X_o$ by the factor of 2 by an additional fixed frequency divider 22 and the output frequency $f_{vco}$ of the voltage controlled oscillator 17 are applied to the D flip-flop 21 to be subjected to digital mixing, the output frequency of the flip-flop 21 being then divided by the factor of N by the programmable divider 18. FIG. 8B shows the relation between the output frequency of the D flip-flop 21 and the input frequency fvco applied thereto, and the symbol B represents the operating regions.

In the embodiments described hereinbefore, the frequencies $f_2$, $f_1 IF$ and fvco are determined according to the equations (4), (5) and (6) respectively. However, there may be various other combinations in addition to the above manner of frequency synthesis.

For example, these frequencies $f_2$, $f_1 IF$ and fvco may be synthesized as follows:

$$f_2 = X_o - f_1 = X_o - 2f_2 IF$$

$$f_1 IF = X_o - f_2 IF$$

$$f_{vco} = f_{T,R} - f_1 IF$$

The transmitting frequency $f_T$ in the AM and SSB transmission and reception modes may then be determined as follows:

AM, SSB(U)

$$f_T = f_{vco} + (X_o - f_2 IF)$$

SSB (L)

$$f_T = f_{vco} + (f_2 + f_2 IF)$$

In the receiving section, the frequency $f_1 IF$ may be obtained using the above value of $f_{vco}$ as the first local oscillation frequency, and the frequency $f_2 IF$ may be obtained using the above value of $X_o$ in the AM and SSB(U) transmission and reception modes or the above value of $f_2$ in the SSB(L) transmission and reception mode, as the second local oscillation frequency.

In another example, the frequencies $f_2$, $f_1 IF$ and $f_{vco}$ may be synthesized as follows:

$$f_2 = X_o + f_1 = X_o + 2f_2 IF$$

$$f_1 IF = X_o + f_2 IF$$

$$f_{vco} = f_{T,R} + f_1 IF$$

The transmitting frequency $f_T$ in the AM and SSB transmission and reception modes may then be determined as follows:

AM, SSB(U)

$$f_T = f_{vco} - (X_o + f_2 IF)$$

SSB(L)

$$f_T = f_{vco} - (f_2 - f_2 IF)$$

In the receiving section, the frequency $f_1 IF$ may be obtained using the above value of $f_{vco}$ as the first local oscillation frequency, and the frequency $f_2 IF$ may be obtained using the above value of $X_o$ in the AM and SSB(U) transmission and reception modes or the above value of $f_2$ in the SSB(L) transmission and reception mode, as the second local oscillation frequency.

In still another example, the frequencies $f_2$, $f_1 IF$ and $f_{vco}$ may be synthesized as follows:

$$f_2 = X_o - f_1 = X_o - 2f_2 IF$$

$$f_1 IF = X_o - f_2 IF$$

$$f_{vco} = f_{T,R} + f_1 IF$$

The transmitting frequency $f_T$ in the AM and SSB transmission and reception modes may then be determined as follows:

AM, SSB(L)

$$f_T = f_{vco} - (X_o - f_2 IF)$$

SSB(U)

$$f_T = f_{vco} - (f_2 + f_2 IF)$$

In the receiving section, the frequency $f_1 IF$ may be obtained using the above value of $f_{vco}$ as the first local oscillation frequency, and the frequency $f_2 IF$ may be obtained using the above value of $X_o$ in the AM and SSB(L) transmission and reception modes, or the above value of $f_2$ in the SSB(U) transmission and reception mode, as the second local oscillation frequency.

It will be understood from the foregoing description that the present invention provides great practical advantages and finds useful industrial applications in that employment of a single crystal oscillator can provide all the frequencies required for the operation of the AM·SSB transceiver of double conversion type.

We claim:

1. A frequency synthesizing system for use in an AM·SSB transceiver of double conversion type comprising a PLL synthesizer, said system comprising:

a single crystal oscillator generating a fundamental frequency $X_o$ of said PLL synthesizer given by the equation $$X_o = 2 \times M \times f_2 IF$$

where M is a positive integer, and $f_2 IF$ is a second intermediate frequency;

means for dividing the fundamental frequency $X_o$ by the factor of M to provide a frequency $f_1$ which is two times the second intermediate frequency $f_2 IF$ and given by the equation $$f_1 = (X_o/M) = 2 \times f_2 IF;$$

means for dividing the frequency $f_1$ by the factor of 2 to provide said second intermediate frequency $f_2 IF$ given by the equation $$f_2 IF = (f_1/2);$$

means for mixing said fundamental frequency $X_o$ and said frequency $f_1$ to provide a frequency $f_2$ which represents the sum of them or the difference therebetween and is given by the equation $$f_2 = X_o + 2 \times f_2 IF;$$

means for providing a first intermediate frequency $f_1 IF$ which represents the sum of said fundamental frequency $X_o$ and said second intermediate frequency $f_2 IF$ or the difference therebetween and is given by the equation $$f_1 IF = X_o \pm f_2 IF;$$

means for dividing said second intermediate frequency $f_2 IF$ or said frequency $f_1 = 2 \times f_2 IF$ to provide one of the two inputs to a phase comparator in said PLL synthesizer for energizing said PLL synthesizer; and voltage controlled oscillator means for providing an output frequency $f_{vco}$ of said PLL synthesizer which frequency represents the sum of a transmitting and receiving frequency $f_{T,R}$ and said first intermediate frequency $f_1 IF$ or the difference therebetween and is given by the equation $$f_{vco} = f_{T,R} \pm f_1 IF$$

whereby all the frequencies required for the operation of the AM·SSB transceiver can be provided by the oscillation of the single crystal oscillator generating the fundamental frequency of said PLL synthesizer.

2. A frequency synthesizing system for an AM·SSB transceiver as claimed in claim 1, wherein said frequencies $f_2$, $f_1 IF$ and $f_{vco}$ are determined according to the equations $$f_2 = X_o + f_1 = X_o + 2 \times f_2 IF$$

$$f_1 IF = X_o + f_2 IF$$

$$f_{vco} = f_{T,R} - f_1 IF,$$

the transmitting frequency $f_T$ in the AM and SSB transmission and reception modes being then determined according to the equations:
AM, SSB(L)

$$f_T = f_{vco} + (X_o + f_2 IF)$$

SSB(U)

$$f_T = f_{vco} + (f_2 - f_2 IF),$$

and, in the receiving section, said first intermediate frequency $f_1 IF$ is determined using the value of said VCO output frequency $f_{vco}$ as the first local oscillation frequency, while said second intermediate frequency $f_2 IF$ is determined using the value of said fundamental frequency $X_o$ in the AM and SSB(L) transmission and reception modes or the value of said frequency $f_2$ in the SSB(U) transmission and reception mode, as the second local oscillation frequency.

3. A frequency synthesizing system for an AM·SSB transceiver as claimed in claim 1, wherein said frequencies $f_2$, $f_1 IF$ and $f_{vco}$ are determined according to the equations $$f_2 = X_o - f_1 = X_o - 2 \times f_2 IF$$

$$f_1 IF = X_o - f_2 IF$$

$$f_{vco} = f_{T,R} - f_1 IF,$$

the transmitting frequency $f_T$ in the AM and SSB transmission and reception modes being then determined according to the equations
AM, SSB(U)

$$f_T = f_{vco} + (X_o - f_2 IF)$$

SSB(L)

$$f_T = f_{vco} + (f_2 + f_2 IF),$$

and, in the receiving section, said first intermediate frequency $f_1 IF$ is determined using the value of said VCO output frequency $f_{vco}$ as the first local oscillation frequency, while said second intermediate frequency $f_2 IF$ is determined using the value of said fundamental frequency $X_o$ in the AM and SSB(U) transmission and reception modes or the value of said frequency $f_2$ in the SSB(L) transmission and reception mode, as the second local oscillation frequency.

4. A frequency synthesizing system for an AM·SSB transceiver as claimed in claim 1, wherein said frequencies $f_2$, $f_1 IF$ and $f_{vco}$ are determined according to the equations $$f_2 = X_o + f_1 = X_o + 2 \times f_2 IF$$

$$f_1 IF = X_o + f_2 IF$$

$$f_{vco} = f_{T,R} + f_1 IF,$$

the transmitting frequency $f_T$ in the AM and SSB transmission and reception modes being then determined according to the equations
AM, SSB(U)

$$f_T = f_{vco} - (X_o + f_2 IF)$$

SSB(L)

$$f_T = f_{vco} - (f_2 - f_2 IF),$$

and, in the receiving section, said first intermediate frequency $f_1 IF$ is determined using the value of said vco output frequency $f_{vco}$ as the first local oscillation frequency, while said second intermediate frequency $f_2 IF$ is determined using the value of said fundamental frequency $X_o$ in the AM and SSB(U) transmission and reception modes or the value of said frequency $f_2$ in the SSB(L) transmission and reception mode, as the second local oscillation frequency.

5. A frequency synthesizing system for an AM·SSB transceiver as claimed in claim 1, wherein said frequencies $f_2$, $f_1 IF$ and $f_{vco}$ are determined according to the equations $$f_2 = X_o - f_1 = X_o - 2 \times f_2 IF$$

$$f_1 IF = X_o - f_2 IF$$

$$f_{vco} = f_{T,R} + f_1 IF,$$

the transmitting frequency $f_T$ in the AM and SSB transmission and reception modes being then determined according to the equations

AM, SSB(L)

$$f_T = f_{vco} - (X_o - f_2 IF)$$

SSB(U)

$$f_T = f_{vco} - (f_2 + f_2 IF).$$

and, in the receiving section, said first intermediate frequency $f_1 IF$ is determined using the value of said vco output frequency $f_{vco}$ as the final local oscillation frequency, while said second intermediate frequency $f_2 IF$ is determined using the value of said fundamental frequency $X_o$ in the AM and SSB(L) transmission and reception modes or the value of said frequency $f_2$ in the SSB(U) transmission and reception mode, as the second local oscillation frequency.

6. A frequency synthesizing system for an AM·SSB transceiver as claimed in claim 1, wherein one of the two inputs of said phase comparator in said PLL synthesizer is provided by dividing said fundamental frequency $X_o$, and the other input is provided by directly dividing the vco output frequency $f_{vco}$ by a programmable divider.

7. A frequency synthesizing system for an AM·SSB transceiver as claimed in claim 6, wherein a frequency obtained by multiplying said fundamental frequency $X_o$ is mixed with said vco output frequency $f_{vco}$ to obtain a difference frequency representing the difference therebetween, and this difference frequency is divided by said programmable divider to provide the second input to said phase comparator.

8. A frequency synthesizing system for an AM·SSB transceiver as claimed in claim 6, wherein said fundamental frequency $X_o$ and said vco output frequency fvco are subjected to digital mixing in a digital mixer, and the output frequency of said digital mixer is divided by said programmable divider to provide the second input to said phase comparator.

9. A frequency synthesizing system for an AM·SSB transceiver as claimed in claim 6, wherein said vco output frequency fvco and a frequency obtained by dividing said fundamental frequency $X_o$ are subjected to digital mixing in a digital mixer, and the output frequency of said digital mixer is divided by said programmable divider to provide the second input to said phase comparator.

10. A frequency synthesizing system for an AM.SSB transceiver as claimed in claim 1, wherein said vco output frequency fvco coincides with the transmitting frequencies $f_T$ in the AM transmission and reception mode.

* * * * *